(12) United States Patent
Floyd et al.

(10) Patent No.: US 8,018,384 B2
(45) Date of Patent: Sep. 13, 2011

(54) METHOD AND APPARATUS FOR PACKAGING AN INTEGRATED CHIP AND ANTENNA

(75) Inventors: Brian Allan Floyd, Mahopac, NY (US); Duixian Liu, Scarsdale, NY (US); Robert M. Morton, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 588 days.

(21) Appl. No.: 12/130,562

(22) Filed: May 30, 2008

(65) Prior Publication Data
US 2009/0015485 A1    Jan. 15, 2009

Related U.S. Application Data

(60) Provisional application No. 60/949,884, filed on Jul. 16, 2007, provisional application No. 60/949,685, filed on Jul. 13, 2007.

(51) Int. Cl.
*H01Q 1/38*     (2006.01)
(52) U.S. Cl. .................. 343/700 MS; 343/795
(58) Field of Classification Search ........... 343/700 MS, 343/702, 846, 795
See application file for complete search history.

(56) References Cited

U.S. PATENT DOCUMENTS

| | | | |
|---|---|---|---|
| 7,095,372 B2 * | 8/2006 | Castany et al. | ........ 343/700 MS |
| 7,119,745 B2 | 10/2006 | Gaucher et al. | |
| 7,342,299 B2 | 3/2008 | Gaucher et al. | |
| 7,372,408 B2 | 5/2008 | Gaucher et al. | |
| 7,586,193 B2 * | 9/2009 | Weste | ........................... 257/728 |
| 2006/0001572 A1 | 1/2006 | Gaucher et al. | |
| 2007/0063056 A1 | 3/2007 | Gaucher et al. | |
| 2007/0164907 A1 | 7/2007 | Gaucher et al. | |
| 2008/0029886 A1 | 2/2008 | Cotte et al. | |

OTHER PUBLICATIONS

T. Zwick et al., "Broadband Planar Millimeter Wave Dipole with Flip-Chip Interconnect," Proceedings of the 2007 IEEE AP-S International Symposium, Jun. 10-15, 2007, pp. 5047-5050, Honolulu, Hawaii.

J. Grzyb et al., "Wideband Cavity-Backed Folded Dipole Superstrate Antenna for 60 GHz Applications," Proceedings of the 2006 IEEE AP-S International Symposium, Jul. 2006, pp. 3939-3942.

(Continued)

*Primary Examiner* — Tan Ho
(74) *Attorney, Agent, or Firm* — Anne V. Dougherty; Ryan, Mason & Lewis, LLP

(57) ABSTRACT

In an illustrative embodiment, an apparatus includes at least one antenna structure located on a first surface of a first substrate; at least one pad located on the first surface of the first substrate; and at least one via traversing the first substrate and thereby connecting the at least one pad located on the first surface of the first substrate to at least one pad located on a second surface. The at least one pad located on the first surface of the first substrate is operatively coupleable to at least one pad located on a surface of an integrated circuit and the at least one pad located on the second surface is operatively coupleable to at least one pad located on a surface of a printed circuit board. The at least one via is thereby operative to couple the at least one pad located on the surface of the integrated circuit and the at least one pad located on the surface of the printed circuit board.

20 Claims, 5 Drawing Sheets

OTHER PUBLICATIONS

T. Zwick et al., "Broadband Planar Superstrate Antenna for Integrated mmWave Transceivers," IEEE Transactions on Antennas and Propagation, Oct. 2006, pp. 2790-2796, vol. 54, No. 10.

U.S. Appl. No. 12/034,023 filed in the name of B.A. Floyd et al. on Feb. 20, 2008 and entitled "Radio Frequency (RF) Integrated Circuit (IC) Packages with Integrated Aperture Coupled Patch Antennas."

U.S. Appl. No. 12/045,377 filed in the name of Duixian Liu on Mar. 10, 2008 and entitled "Wafer-Scale Phased Array."

U.S. Appl. No. 12/102,051 filed in the name of J.A.G. Akkermans et al. on Apr. 14, 2008 and entitled "Radio Frequency (RF) Integrated Circuit (IC) Packages with Integrated Aperture-Coupled Patch Antenna(s) in Ring and/or Offset Cavities."

* cited by examiner

METHOD AND APPARATUS FOR PACKAGING AN INTEGRATED CHIP AND ANTENNA

CROSS-REFERENCE TO RELATED APPLICATIONS

This application claims the benefit of U.S. Provisional Application No. 60/949,884, filed Jul. 16, 2007, and U.S. Provisional Application No. 60/949,685, filed Jul. 13, 2007, the disclosures of which are incorporated by reference herein.

FIELD OF THE INVENTION

The present invention relates generally to integrated circuit (chip) packaging with integrated antennas or planar phased arrays. Specifically, it is related to chip packaging with integrated antennas or planar phased array designs for millimeter wave (mmWave) frequencies and above.

BACKGROUND OF THE INVENTION

In a wireless network, connectivity and communication between devices is achieved through antennas attached to receivers or transmitters in order to radiate the desired signals to or from other elements of the network. In radio communication systems, such as millimeter-wave radios, discrete components are usually assembled with low integration levels. These systems are often assembled using expensive and bulky waveguides and package-level or board-level microstrip structures to interconnect semiconductors and their required transmitter or receiver antennas.

With recent progress in semiconductor technology and packaging engineering, the dimensions of these radio communication systems have become smaller and integration of antennas with their radio frequency (RF) front-end circuits has become more desirable. For applications such as wireless universal serial bus (USB), the operating distance is limited to about a meter; a single antenna with about 7 dBi at 60 GHz will provide the necessary antenna gains.

However, for point-to-point applications which require operating distances of ten meters (such as wireless video) or longer (such as military radar), antenna gains as high as 30 dBi may be required. However, because high-gain antennas have very narrow beam widths (thereby making it difficult for consumers to accurately point the antenna), phased arrays (also known as radiation pattern steerable arrays) are necessary.

Typical chip packages with integrated antennas have three major parts: a RF chip, one or more antennas, a package carrier, and a possible package lid/cover (or just using encapsulant to protect the package). The main idea here is to design the carrier that has high performance antennas, an interface for flip-chipping RF chip and interface for flip-chipping the package to printed circuit mother board. There are two expensive components for the antenna part: substrate with antenna structure and feed line, and a metal support frame to form the cavity (etched hole) for the antenna.

For example, J. Grzyb et al., "Wideband Cavity-backed Folded Dipole Superstrate Antenna for 60 GHz Applications," *Proceedings of the 2006 IEEE AP-S International Symposium*, pp. 3939-3942, July 2006, and T. Zwick et al., "Broadband Planar Superstrate Antenna for Integrated mmWave Transceivers," *IEEE Transactions on Antennas and Propagation*, vol. 54, no. 10, pp. 2790-2796, October 2006, the disclosures of which are incorporated by reference herein, describe a broadband planar dipole superstrate antenna suitable for integration with millimeter wave (MMW) transceiver ICs. The dipole is printed on the bottom of a fused silica substrate with a ground plane below. This dipole may then be flip-chip mounted onto a coplanar waveguide (CPW) feed line on the top of the RF chip.

SUMMARY OF THE INVENTION

In an illustrative embodiment, an apparatus includes at least one antenna structure located on a first surface of a first substrate; at least one pad located on the first surface of the first substrate; and at least one via traversing the first substrate and thereby connecting the at least one pad located on the first surface of the first substrate to at least one pad located on a second surface. The at least one pad located on the first surface of the first substrate is operatively coupleable to at least one pad located on a surface of an integrated circuit and the at least one pad located on the second surface is operatively coupleable to at least one pad located on a surface of a printed circuit board. The at least one via is thereby operative to couple the at least one pad located on the surface of the integrated circuit and the at least one pad located on the surface of the printed circuit board.

In another illustrative embodiment, an apparatus comprises a plurality of pads located on a surface of a substrate opposite a printed circuit board; at least one integrated circuit operatively coupled to at least a portion of the plurality of pads and located proximate to the surface of the substrate opposite the printed circuit board; a plurality of antennas located proximate to the surface of the substrate opposite the printed circuit board; and at least one feed line operatively connected between each of the plurality of antennas and a given one or more of the plurality of pads.

In a further illustrative embodiment, a method of forming a package includes the steps of forming an antenna on a first surface of a first substrate; flip-chip mounting an integrated circuit to the first surface of the first substrate; and flip-chip mounting a second surface opposite the first surface of the first substrate to a printed circuit board. The second surface may be a surface of the first substrate or the second surface may be a surface of a second substrate.

Illustrative embodiments of the present invention may be easy and cost effective to manufacture while providing superior performance. Moreover, illustrative embodiments may also provide a more effective way to dissipate the heat from the chip.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

While reference may be made herein to certain device components, it is to be understood that the present invention is not limited to these or any particular device components or arrangements thereof.

Figure 1:
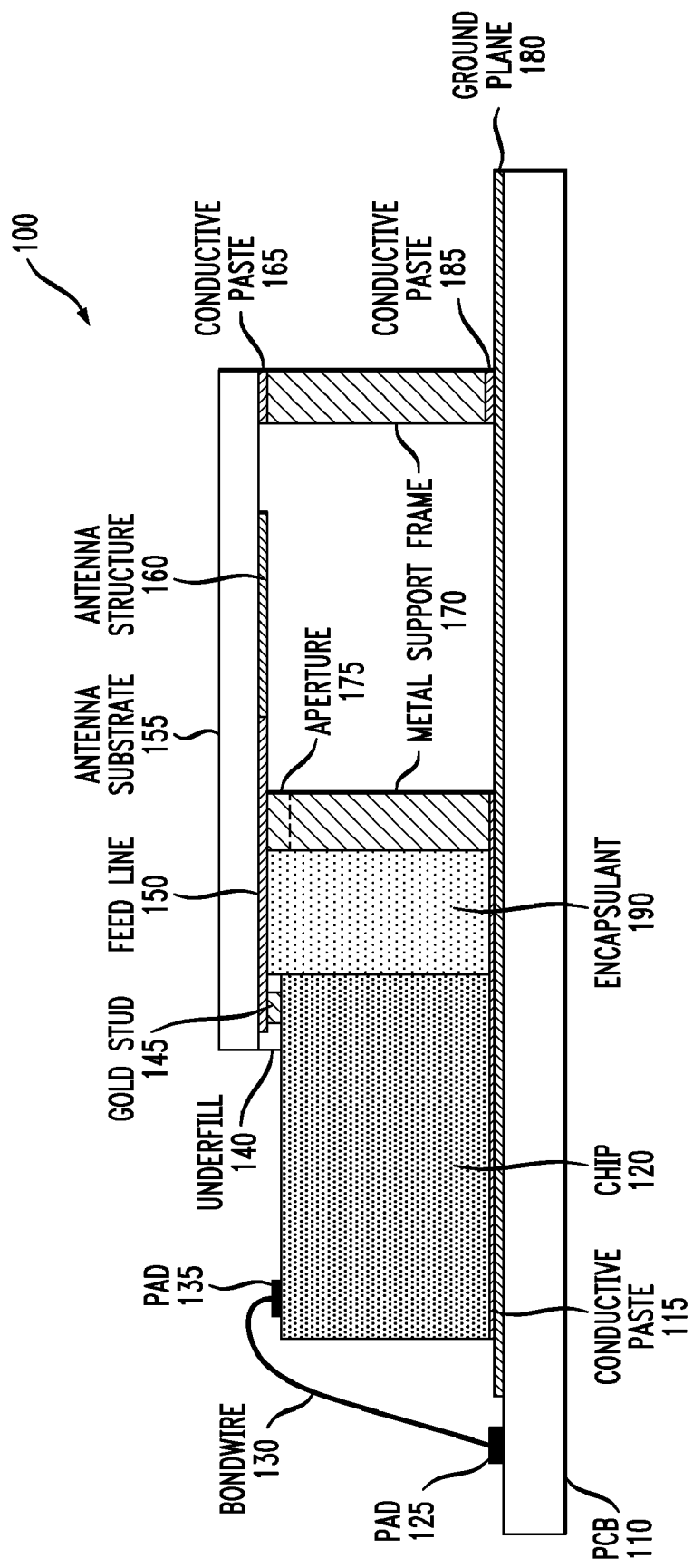
FIG. 1 is a cross-section of a package with an integrated antenna.

FIG. 1 shows a package concept with an integrated antenna similar to that described in the Grzyb et al. and Zwick et al. references cited above. This package is well-suited for lab study and testing because of its high performance. For example, an implemented package with a folded dipole antenna of 100 ohms input impedance yields return loss bandwidth more than 30% with efficiency better than 85% and a minimum 7 dBi gain.

Although the cost is relatively low for small-scale production, such as that used for the aforementioned lab study and testing, this package requires the use of expensive components such as the substrate with antenna structure and feed line and the metal support frame to form the cavity (etched hole) for the antenna.

Moreover, packaging the chip and the antenna requires a complex process, including the following steps:

1. Glue chip 120 to ground plane 180 on printed circuit board (PCB) 110 using conductive paste 115.
2. Connect pad 125 on PCB 110 to pad 135 on chip 120 with bondwire 130, thereby wirebonding chip 120 to PCB 110.
3. Place gold studs 145 on corresponding pads of chip 120 for connections to antenna 160 through feedline 150.
4. Glue antenna substrate 155 to metal support frame 170 using conductive paste 165 to form the antenna subassembly.
5. Bake the antenna subassembly in a special oven.
6. Flip-chip the antenna subassembly to chip 120.
7. Glue metal support frame 170 to ground plane 180 on PCB 110 using conductive paste 185.
8. Fill the contact area between chip 120 and feedline 150 with underfill 140.
9. Fill the gap between chip 120 and metal support frame 170 with encapsulant 190.
10. Bake antenna assembly 100 in a special oven again.

Because of the complexity of this manufacturing process, it is difficult to mass produce this package at a low cost using an automated process. By contrast, an illustrative embodiment of the present invention may be built simply by flip-chipping a chip to the package then flip-chipping the package to a printed circuit board. Moreover, because antenna 160 overlays chip 120, it may be difficult to effectively dissipate the heat from the chip. For example, it would be difficult to mount a heatsink on chip 120 without interfering with the radiation pattern of antenna 160.

Figure 2:
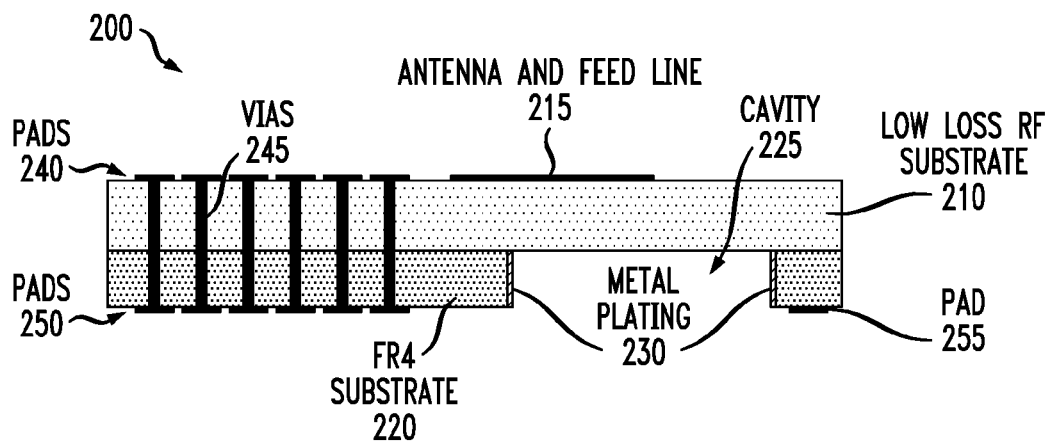
FIG. 2 is a cross-section of an exemplary two-substrate carrier, according to an embodiment of the invention.

FIG. 2 is a cross-section of exemplary two-substrate carrier 200, according to an embodiment of the invention. Substrate 210 is preferably a low loss substrate suitable for RF or mmWave applications, such as fused silica. However, any substrate may be used in conjunction with inventive techniques, although one having skill in the art will recognize that a low-loss substrate is preferable. In a preferred embodiment, substrate 210 may have a thickness of approximately 200-300 μm, though this is not a requirement of the invention.

Antenna structure 215 (including antenna feed lines and necessary pads for flip-chip connections) is preferably printed on an upper surface of substrate 210. It should be noted that antenna structure 215 may be formed using an alternative process, such as, for example, photolithography, chemical etching, a thin-film metal patterning process, or a high-resolution gold deposition process.

Substrate 220 is preferably comprised of FR-4. However, any suitable material may be used, including but not limited to FR-2 or G-10. In a preferred embodiment, substrate 220 may have a thickness of approximately 300-400 μm, though this is not a requirement of the invention. Substrate 220 preferably has a cutout or cavity 225 with metal-plated walls 230 to improve the performance of antenna 215. Metal-plated walls 230 may be formed of a wide variety of electrically conductive metals including but not limited to copper.

Pads 240 on the upper surface of substrate 210 and pads 250 on the lower surface of substrate 220 are connected by plated through vias 245, which pass through substrates 210 and 220. Because vias 245 are preferably for low frequency applications, vias 245 may comprise stepped vias. Pad 255 may also be formed on the lower surface of substrate 220 without a corresponding via.

Figure 3:
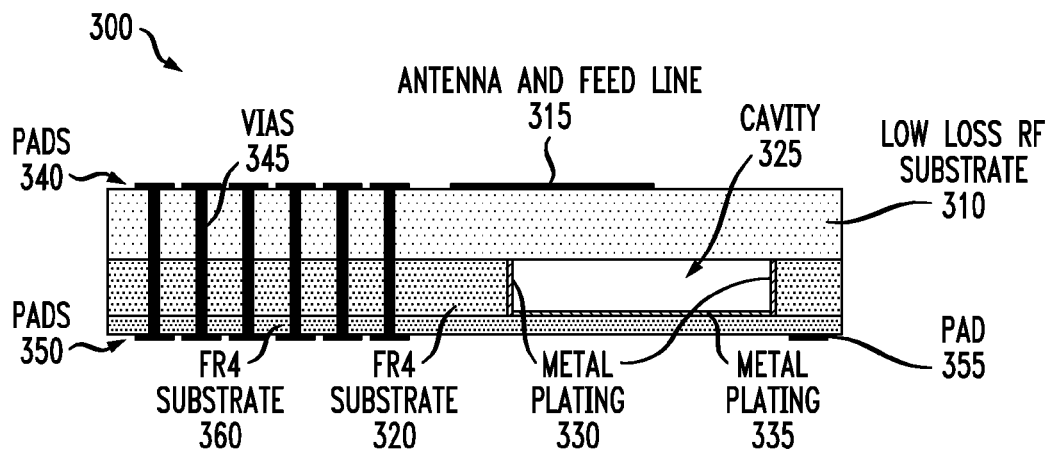
FIG. 3 is a cross-section of an exemplary three-substrate carrier, according to an embodiment of the invention.

FIG. 3 is a cross-section of exemplary three-substrate carrier 300, according to an embodiment of the invention. Substrate 310 is preferably a low loss substrate suitable for RF or mmWave applications, such as fused silica. However, any substrate may be used in conjunction with inventive techniques, although one having skill in the art will recognize that a low-loss substrate is preferable. In a preferred embodiment, substrate 310 may have a thickness of approximately 200-300 μm, though this is not a requirement of the invention.

Antenna structure 315 (including antenna feed lines and necessary pads for flip-chip connections) is preferably printed on an upper surface of substrate 310. It should be noted that antenna structure 315 may be formed using an alternative process, such as, for example, photolithography, chemical etching, a thin-film metal patterning process, or a high-resolution gold deposition process.

Substrate 320 is located between substrate 310 and substrate 360. Substrate 320 is preferably comprised of FR-4. However, any suitable material may be used, including but not limited to FR-2 or G-10. In a preferred embodiment, substrate 320 may have a thickness of approximately 300-400 μm, though this is not a requirement of the invention. Substrate 320 preferably has a cutout or cavity 325 with metal-plated walls 330 to improve the performance of antenna 315. Metal-plated walls 330 may be formed of a wide variety of electrically conductive metals including but not limited to copper.

Substrate 360 is preferably comprised of FR-4. However, any suitable material may be used, including but not limited to FR-2 or G-10. Metal plating 335 on an upper surface of substrate 360 forms cavity 325 in conjunction with metal-plated walls 330 in substrate 320. Metal plating 335 may act as a ground plane for antenna 315.

Pads 340 on the upper surface of substrate 310 and pads 350 on the lower surface of substrate 360 are connected by plated through vias 345, which pass through substrates 310, 320 and 360. Because vias 345 are preferably for low frequency applications, vias 345 may comprise stepped vias. Pad 355 may also be formed on the lower surface of substrate 360 without a corresponding via.

Figure 4:
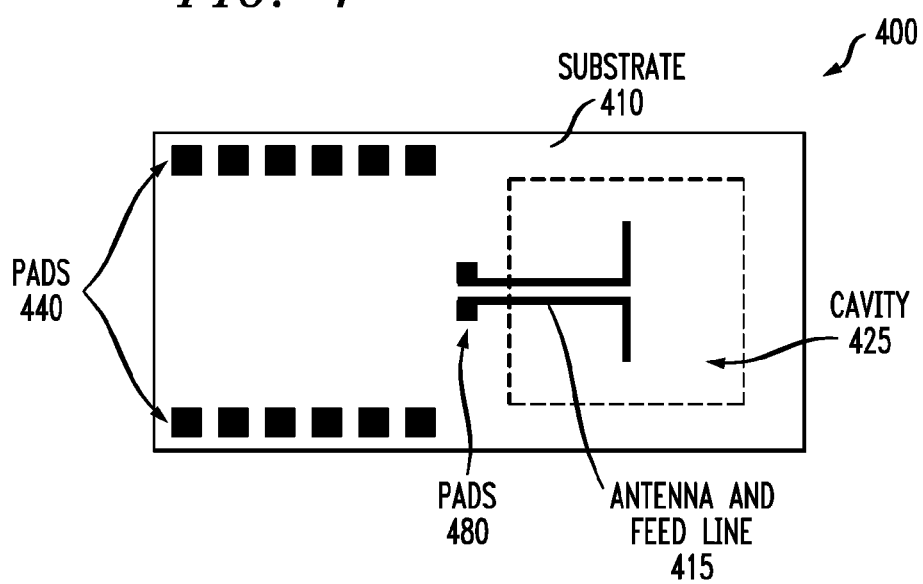
FIG. 4 is a top view of an exemplary two- or three-substrate carrier, according to an embodiment of the invention.

FIG. 4 shows a top view of carrier 400, which may be similar to carriers 200 and 300 shown in FIGS. 2 and 3. Pads 440 and 480 are formed on an upper surface of substrate 410.

Antenna 415 is preferably connected to pads 480 through one or more feedlines. Cavity 425 is located underneath antenna 415 and substrate 410.

Figure 5:
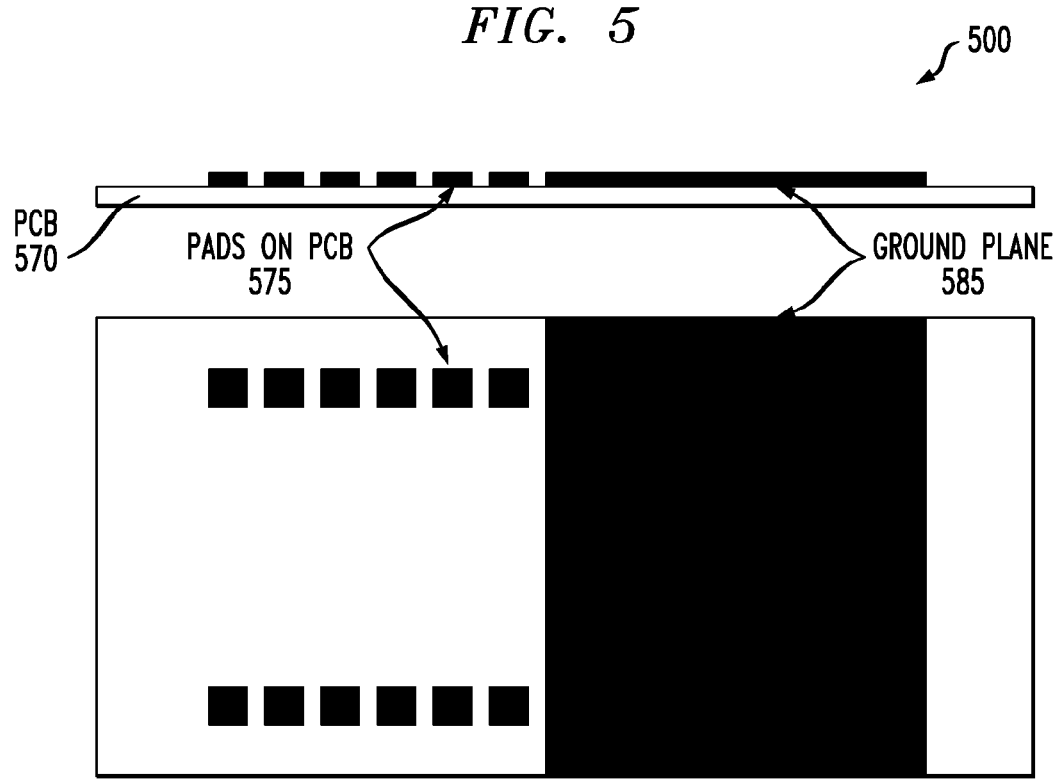
FIG. 5 shows a top view and a cross-section of an exemplary printed circuit board, according to an embodiment of the invention.

FIG. 5 is a cross-section of exemplary printed circuit board (PCB) structure 500, according to an illustrative embodiment of the present invention. PCB structure 500 comprises PCB 570, which may be formed of, for example, FR-4, FR-2 and/or G-10. PCB 570 has pads 575 located thereon, which preferably correspond to pads 250 shown in FIG. 2 or pads 350 shown in FIG. 3. PCB 570 may also have a metal plate 585 formed thereon, which may function as a ground plane in some embodiments.

Figure 6:
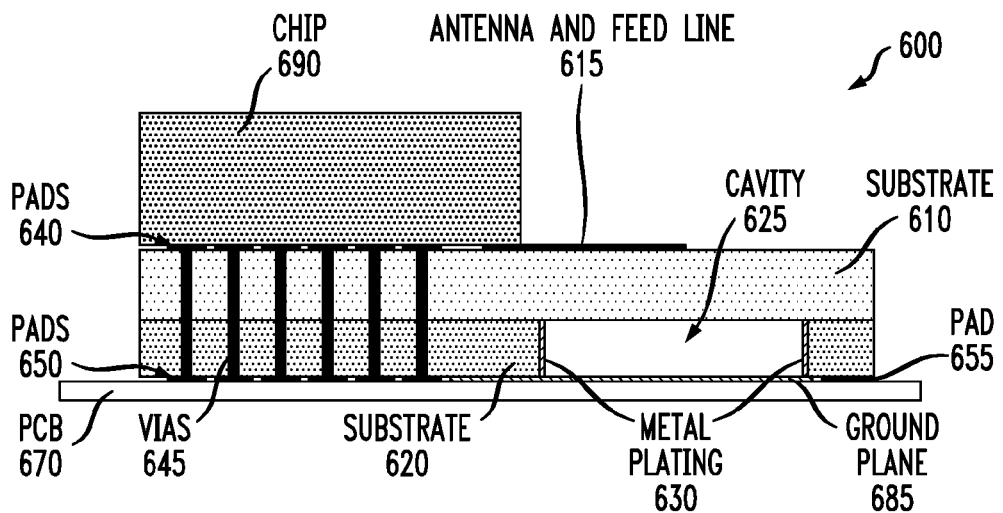
FIG. 6 is a cross-section of an exemplary two-substrate package, according to an embodiment of the invention.

FIG. 6 is a cross-section of exemplary two-substrate package 600, according to an embodiment of the invention. In a preferred embodiment, package 600 is formed by flip-chipping a carrier similar to carrier 200 in FIG. 2 to a PCB structure similar to PCB structure 500 in FIG. 5, then flip-chipping chip 690 to the carrier.

Substrate 610 is preferably a low loss substrate suitable for RF or mmWave applications, such as fused silica. However, any substrate may be used in conjunction with inventive techniques, although one having skill in the art will recognize that a low-loss substrate is preferable. In a preferred embodiment, substrate 610 may have a thickness of approximately 200-300 µm, though this is not a requirement of the invention.

Antenna structure 615 (including antenna feed lines and necessary pads for flip-chip connections) is preferably printed on an upper surface of substrate 610. It should be noted that antenna structure 615 may be formed using an alternative process, such as, for example, photolithography, chemical etching, a thin-film metal patterning process, or a high-resolution gold deposition process.

Substrate 620 is preferably comprised of FR-4. However, any suitable material may be used, including but not limited to FR-2 or G-10. In a preferred embodiment, substrate 620 may have a thickness of approximately 300-400 µm, though this is not a requirement of the invention. Substrate 620 preferably has a cutout or cavity 625 with metal-plated walls 630 to improve the performance of antenna 615. Metal plate 685 on PCB 670 preferably acts as a ground plane and forms cavity 625 in conjunction with metal-plated walls 630 in substrate 620. Metal-plated walls 630 and metal plate 685 may be formed from a wide variety of electrically conductive metals including but not limited to copper.

Pads 640 on the upper surface of substrate 610 are adjacent to corresponding pads on the lower surface of chip 690 and pads 650 on the lower surface of substrate 620 are adjacent to corresponding pads on the upper surface of PCB 670. Pads 640 and 650 are connected by plated through vias 645, which pass through substrates 610 and 620. Because vias 645 are preferably for low frequency applications, vias 645 may comprise stepped vias. Vias 645 provide ground, power, control and signal connections between chip 690 and PCB 670. Chip 690 may be, for example, an radio-frequency (RF) transmitter/receiver (Tx/Rx) chip. Pad 655 may also be formed on the lower surface of substrate 620 without a corresponding via.

Figure 7:
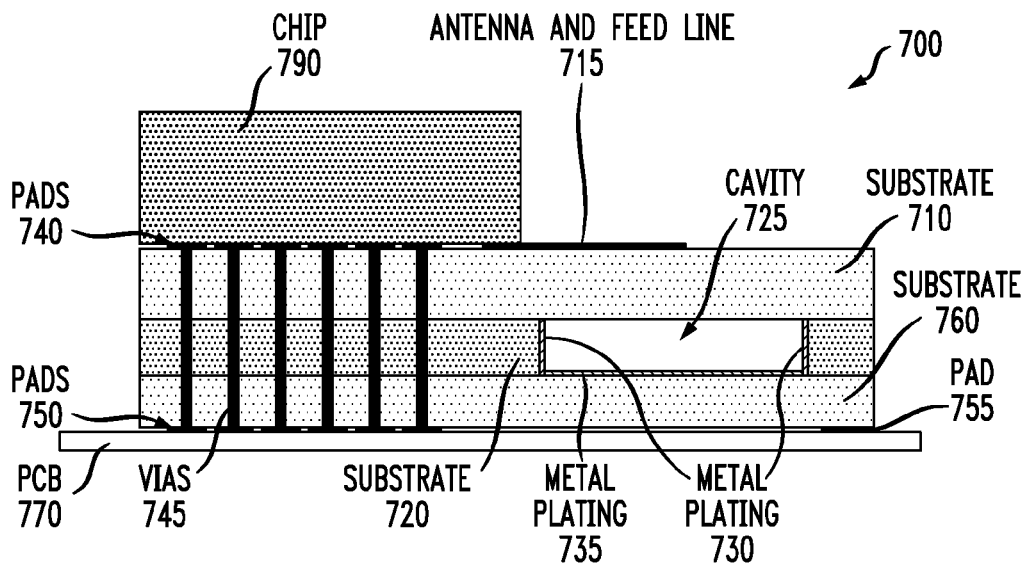
FIG. 7 is a cross-section of an exemplary three-substrate package, according to an embodiment of the invention.

FIG. 7 is a cross-section of exemplary three-substrate package 700, according to an embodiment of the invention. In a preferred embodiment, package 700 is formed by flip-chipping a carrier similar to carrier 300 in FIG. 3 to a PCB structure similar to PCB structure 500 in FIG. 5, then flip-chipping chip 790 to the carrier.

Substrate 710 is preferably a low loss substrate suitable for RF or mmWave applications, such as fused silica. However, any substrate may be used in conjunction with inventive techniques, although one having skill in the art will recognize that a low-loss substrate is preferable. In a preferred embodiment, substrate 710 may have a thickness of approximately 200-300 µm, though this is not a requirement of the invention.

Antenna structure 715 (including antenna feed lines and necessary pads for flip-chip connections) is preferably printed on an upper surface of substrate 710. It should be noted that antenna structure 715 may be formed using an alternative process, such as, for example, photolithography, chemical etching, a thin-film metal patterning process, or a high-resolution gold deposition process.

Substrate 720 is located between substrate 710 and substrate 760. Substrate 720 is preferably comprised of FR-4. However, any suitable material may be used, including but not limited to FR-2 or G-10. In a preferred embodiment, substrate 720 may have a thickness of approximately 300-400 µm, though this is not a requirement of the invention. Substrate 720 preferably has a cutout or cavity 725 with metal-plated walls 730 to improve the performance of antenna 715. Metal-plated walls 730 and metal plate 785 may be formed from a wide variety of electrically conductive metals including but not limited to copper.

Substrate 760 is preferably comprised of FR-4. However, any suitable material may be used, including but not limited to FR-2 or G-10. Metal plating 735 on an upper surface of substrate 760 forms cavity 725 in conjunction with metal-plated walls 730 in substrate 720. Metal plating 735 may act as a ground plane for antenna 715, in which case PCB 770 need not provide a ground plane. Locating ground plane 735 on substrate 760 instead of PCB 770 advantageously reduces the risk that encapsulant material may enter cavity 725.

Pads 740 on the upper surface of substrate 710 are adjacent to corresponding pads on the lower surface of chip 790 and pads 750 on the lower surface of substrate 760 are adjacent to corresponding pads on the upper surface of PCB 770. Pads 740 and 750 are connected by plated through vias 745, which pass through substrates 710, 720 and 760. Because vias 745 are preferably for low frequency applications, vias 745 may comprise stepped vias. Vias 745 provide ground, power, control and signal connections between chip 790 and PCB 770. Chip 790 may be, for example, an radio-frequency (RF) transmitter/receiver (Tx/Rx) chip. Pad 755 may also be formed on the lower surface of substrate 760 without a corresponding via.

Figure 8:
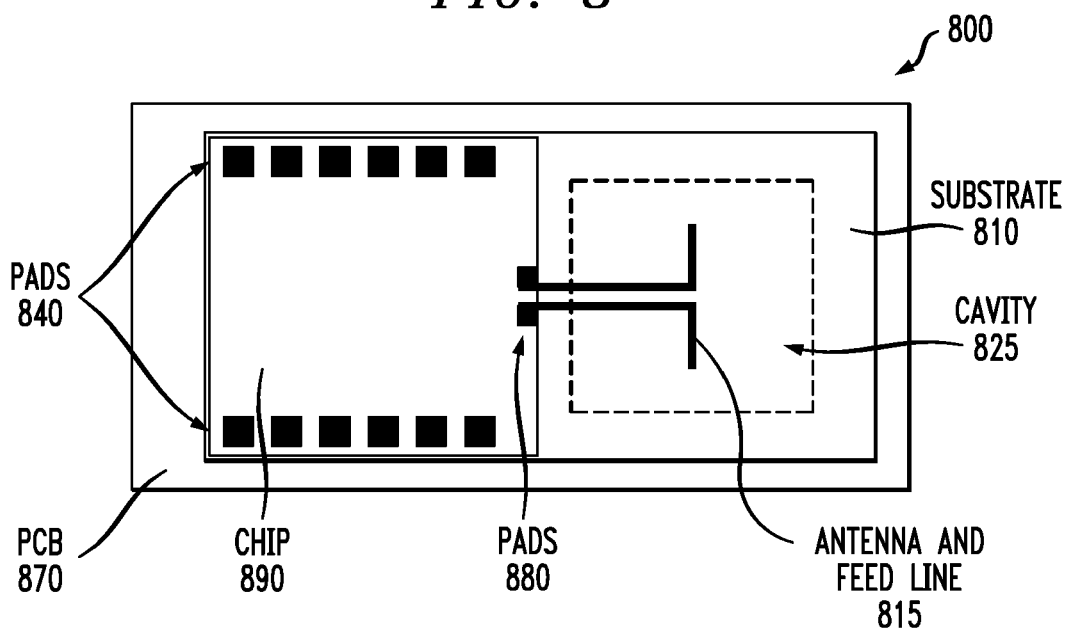
FIG. 8 is a top view of an exemplary two- or three-substrate package, according to an embodiment of the invention.

FIG. 8 shows a top view of an exemplary package 800, which may be similar to packages 600 and 700 shown in FIGS. 6 and 7. Chip 890 is positioned above pads 840 on substrate 810 such that pads on the underside of chip 890 are adjacent to corresponding pads 840. Antenna 815 is preferably connected to pads 880, which may be formed on an upper surface of substrate 810 and/or on a lower surface of chip 890. Cavity 825 is located underneath antenna 815. All components are deposited on top of PCB 870.

Figure 9:
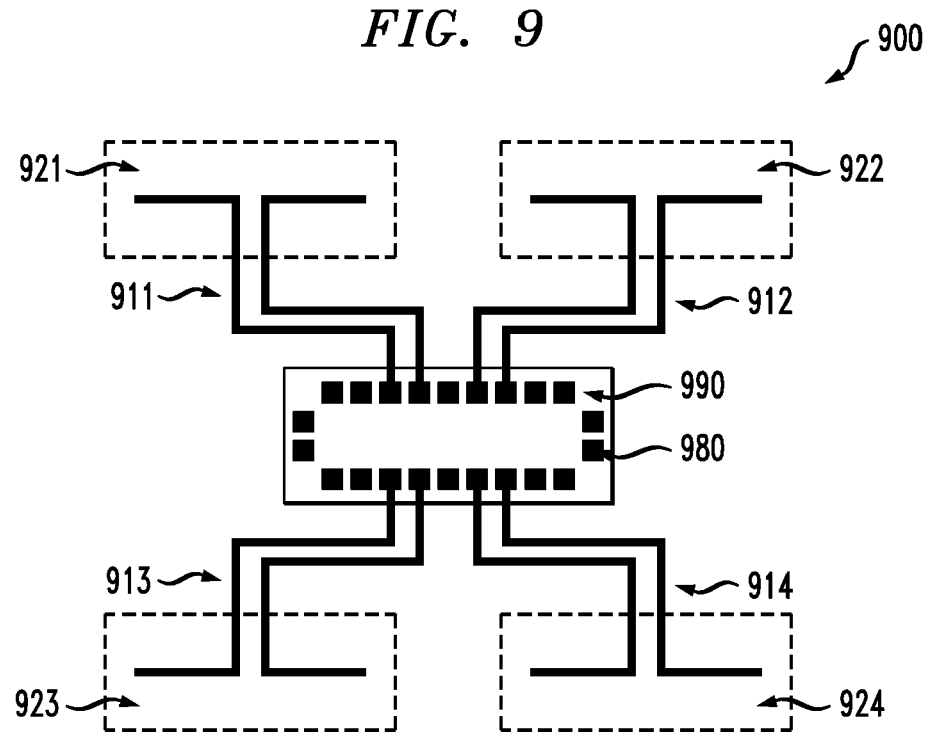
FIG. 9 is a top view of an exemplary phased array layout, according to an embodiment of the invention.

FIG. 9 shows an exemplary package 900 with a 2×2 planar phased array layout. It is possible to have more than two antennas on each row. This basic 2×2 array can be used to form much larger arrays. In addition to first antenna 921 with first feed line 911, also included are second, third and fourth antennas 922, 923, 924 with corresponding second, third and fourth feed lines 912, 913, 914. Each feed line is connected to one or more pads 980 of chip 990 to form a planar phased array. A single large ground plane can be employed in phased array embodiments or each antenna may have its own ground plane. A phased array can include any number of antennas greater than or equal to two; however, powers of two are advantageous, e.g., 2, 4, 8, 16, 32, and so on.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. An apparatus comprising:
   at least one antenna structure located on a first surface of a first substrate; and
   at least one pad located on the first surface of the first substrate; and
   wherein the first substrate is between the at least one antenna structure and a second substrate, the second substrate having a cavity located between at least a portion of the at least one antenna structure and at least a portion of a ground plane.

2. The apparatus of claim 1, wherein the at least one antenna structure comprises at least one feed line operatively coupled to the at least one pad located on the first surface.

3. The apparatus of claim 1, wherein one or more surfaces of the second substrate adjacent to the cavity are plated with metal.

4. The apparatus of claim 1, further comprising at least one via traversing at least the first and second substrates and thereby connecting the at least one pad located on the first surface of the first substrate to at least one pad located on a second surface.

5. The apparatus of claim 4, wherein the second surface is a surface of the second substrate.

6. The apparatus of claim 4, wherein the ground plane is located proximate to the second surface.

7. The apparatus of claim 4, wherein the second substrate is between the first substrate and a third substrate;
   wherein the at least one via traverses the first, second and third substrates; and
   wherein the second surface is a surface of the third substrate.

8. The apparatus of claim 7, wherein surfaces of the second and third substrates adjacent to the cavity are plated with metal.

9. The apparatus of claim 7, wherein a surface of the third substrate adjacent to the cavity provides a ground plane.

10. The apparatus of claim 4, wherein the at least one pad located on the first surface of the first substrate is operatively coupleable to at least one pad located on a surface of an integrated circuit; the at least one pad located on the second surface is operatively coupleable to at least one pad located on a surface of a printed circuit board; and the at least one via is thereby operative to couple the at least one pad located on the surface of the integrated circuit and the at least one pad located on the surface of the printed circuit board.

11. The apparatus of claim 10, wherein the first surface is capable of having the integrated circuit flip-chip mounted thereto.

12. The apparatus of claim 10, wherein the second surface is capable of having the printed circuit board flip-chip mounted thereto.

13. The apparatus of claim 10, wherein the ground plane is formed on the surface of the printed circuit board.

14. The apparatus of claim 1, wherein the first and second substrates are of different compositions.

15. An apparatus comprising:
   a plurality of pads located on a surface of a first substrate;
   at least one integrated circuit operatively coupled to at least a portion of the plurality of pads and located proximate to the surface of the first substrate;
   a plurality of antennas located proximate to the surface of the first substrate; and
   at least one feed line operatively connected between each of the plurality of antennas and a given one or more of the plurality of pads;
   wherein the first substrate is between the plurality of antenna structures and a second substrate, the second substrate having a cavity located between at least a portion of at least a given one of the plurality of antennas and at least a portion of a ground plane.

16. The apparatus of claim 15, further comprising:
   at least one pad proximate to a surface of a printed circuit board and located between the second substrate and the printed circuit board; and
   at least one via traversing the first and substrates, wherein each via connects a given one of the plurality of pads located between the integrated circuit and the first substrate with the at least one pad located proximate to the surface of the printed circuit board.

17. A method of packaging an antenna, comprising the steps of:
   forming an antenna on a first surface of a first substrate;
   flip-chip mounting an integrated circuit to the first surface of the first substrate; and
   flip-chip mounting a second surface opposite the first surface of the first substrate to a printed circuit board;
   wherein the first substrate is between the antenna and a second substrate, the second substrate having a cavity located between at least a portion of the antenna and at least a portion of a ground plane.

18. The method of claim 17, further comprising the step of forming at least one via traversing the first and second substrates, the at least one via operatively coupling at least one pad located on the first surface to the at least one via connecting the at least one pad located on the second surface.

19. The method of claim 18, wherein the at least one via operatively couples at least one pad located on a surface of the integrated circuit adjacent to the first surface to at least one pad located on a surface of the printed circuit board adjacent to the second surface.

20. The method of claim 17, wherein the second surface is a surface of a second substrate.

* * * * *